United States Patent
Lee et al.

(10) Patent No.: US 8,803,586 B1
(45) Date of Patent: Aug. 12, 2014

(54) DOWN-CONVERSION FREQUENCY MIXER CIRCUIT

(71) Applicant: National Chi Nan University, Nantou (TW)

(72) Inventors: Jen-How Lee, Nantou (TW); Yo-Sheng Lin, Nantou (TW); Wei-Chen Wen, Nantou (TW)

(73) Assignee: National Chi Nan University, Puli, Nantou (TW)

( * ) Notice: Subject to any disclaimer, the term of this patent is extended or adjusted under 35 U.S.C. 154(b) by 0 days.

(21) Appl. No.: 14/060,021

(22) Filed: Oct. 22, 2013

(30) Foreign Application Priority Data

May 24, 2013 (TW) .............................. 102118445 U

(51) Int. Cl.
*G06G 7/12* (2006.01)
*H03D 7/14* (2006.01)

(52) U.S. Cl.
CPC .................................. *H03D 7/1441* (2013.01)
USPC ........................................... 327/355; 455/313

(58) Field of Classification Search
USPC ........................................... 327/355; 455/313
See application file for complete search history.

(56) References Cited

U.S. PATENT DOCUMENTS 6,255,889 B1 * 7/2001 Branson ......................... 327/359

* cited by examiner

*Primary Examiner* — William Hernandez
(74) *Attorney, Agent, or Firm* — Merchant & Gould P.C.

(57) ABSTRACT

A frequency mixer circuit includes a gain stage and a mixer. The gain stage has a specific circuit design to convert a differential input voltage signal into a differential current signal with an input frequency. The mixer receives a differential local oscillator (LO) voltage signal with a LO frequency, and the differential current signal from the gain stage, and outputs a differential output voltage signal having a mixed frequency associated with the input frequency and the LO frequency.

18 Claims, 7 Drawing Sheets

DOWN-CONVERSION FREQUENCY MIXER CIRCUIT

CROSS-REFERENCE TO RELATED APPLICATION

This application claims priority to Taiwanese Application No. 102118445, filed on May 24, 2013.

BACKGROUND OF THE INVENTION

1. Field of the Invention

The invention relates to a frequency mixer circuit, and more particularly to a down-conversion frequency mixer circuit.

2. Description of the Related Art

FIG. 1 shows a conventional Gilbert cell mixer circuit including a balun 11, a radio-frequency (RF) voltage-to-current (V-to-I) converter 12, and a mixer 13.

The balun 11 has a local oscillator (LO) terminal to receive a single-ended LO voltage signal VLO with a frequency $f_{LO}$ and converts the single-ended LO voltage signal into a differential LO voltage signal VDLO.

The RF V-to-I converter 12 has an input terminal to receive a single-ended RF voltage signal VRF with a frequency $f_{RF}$, and performs voltage-to-current conversion on the single-ended RF voltage signal VRF to generate a differential RF current signal IDRF. The RF V-to-I converter 12 includes inductors L1, L2, transistors M1, M2, and a capacitor C1 coupled between a drain terminal of the transistor M1 and a gate terminal of the transistor M2.

The transistor M1 has a gate terminal receiving the single-ended RF voltage signal VRF, a grounded source terminal, and a drain terminal coupled to a first terminal of the inductor L1. The transistor M2 has a grounded source terminal and a drain terminal coupled to a first terminal of the inductor L2. The differential RF current signal IDRF is generated at second terminals of the inductors L1, L2, and includes a current $I_{D1}$ flowing through the inductor L1.

The mixer 13 is coupled to the balun 11 through capacitors C2, C3 for receiving the differential LO voltage signal VDLO therefrom, is coupled to the inductors L1, L2 for receiving the differential RF current signal IDRF, and has a pair of output terminals to output a differential intermediate-frequency voltage signal VDIF with a frequency $f_{IF}$ equal to a difference between $f_{RF}$ and $f_{LO}$ (i.e., $f_{IF}=f_{RF}-f_{LO}$).

When the conventional Gilbert cell mixer circuit is operated at radio frequency, the current $I_{D1}$ is approximate to a current $I_{D3}$ flowing through the drain terminal of the transistor M3 (i.e., $I_{D1} \approx I_{D3}$). The Gilbert cell mixer circuit has a conversion gain (CG) as given in the following equation:

$$CG = \frac{VDIF}{VRF} = \frac{ID1}{ID3} \times g_{m1} \times R \times A$$

where $g_{m1}$ is transconductance of the transistor M1, R is equivalent output impedance at the second terminal of the inductor L1, and A is a conversion gain of the mixer 13.

The aforementioned conventional Gilbert cell mixer circuit does not have sufficient conversion gain since the current $I_{D1}$ is approximate to the current $I_{D3}$. In addition, FIG. 2 shows that the conventional Gilbert cell mixer circuit has insufficient isolations among the LO terminal, the input terminal and the output terminals. In particular, since the RF V-to-I converter 12 has only one transistor stage that includes the transistors M1, M2, signals at the LO terminal, the input terminal, and the output terminals of the mixer 13 may interfere with each other, resulting in low isolations.

SUMMARY OF THE INVENTION

Therefore, an object of the present invention is to provide a frequency mixer circuit that has a relatively high conversion gain.

According to the present invention, a frequency mixer circuit comprises:

a gain stage including:

first and second inductors each having a first terminal and a second terminal, the second terminals of the first and second inductors being disposed to receive a differential input voltage signal;

first and second transistors each having a first terminal, a second terminal and a control terminal, the first terminals of the first and second transistors outputting a differential current signal with an input frequency, the second terminals of the first and second transistors being coupled respectively to the first terminals of the first and second inductors;

a first capacitor-inductor pair that includes a capacitor and an inductor coupled in series and that is coupled between the control terminal of the first transistor and the second terminal of the first inductor; and a second capacitor-inductor pair that includes a capacitor and an inductor coupled in series and that is coupled between the control terminal of the second transistor and the second terminal of the second inductor; and a mixer disposed to receive a differential local oscillator (LO) voltage signal with a LO frequency, coupled to the first terminals of the first and second transistors of the gain stage for receiving the differential current signal therefrom, and configured to output a differential output voltage signal having a mixed frequency associated with the input frequency and the LO frequency.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
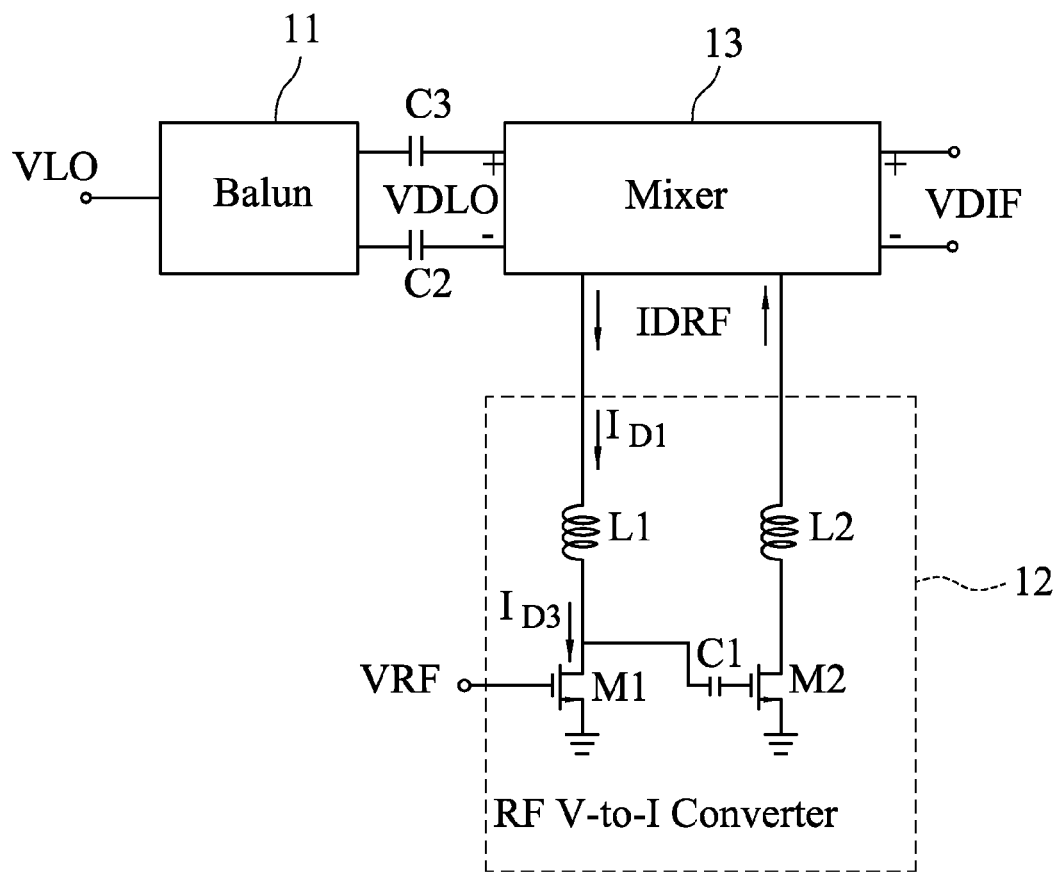
FIG. 1 is a schematic diagram illustrating a conventional Gilbert cell mixer circuit.
Figure 2:
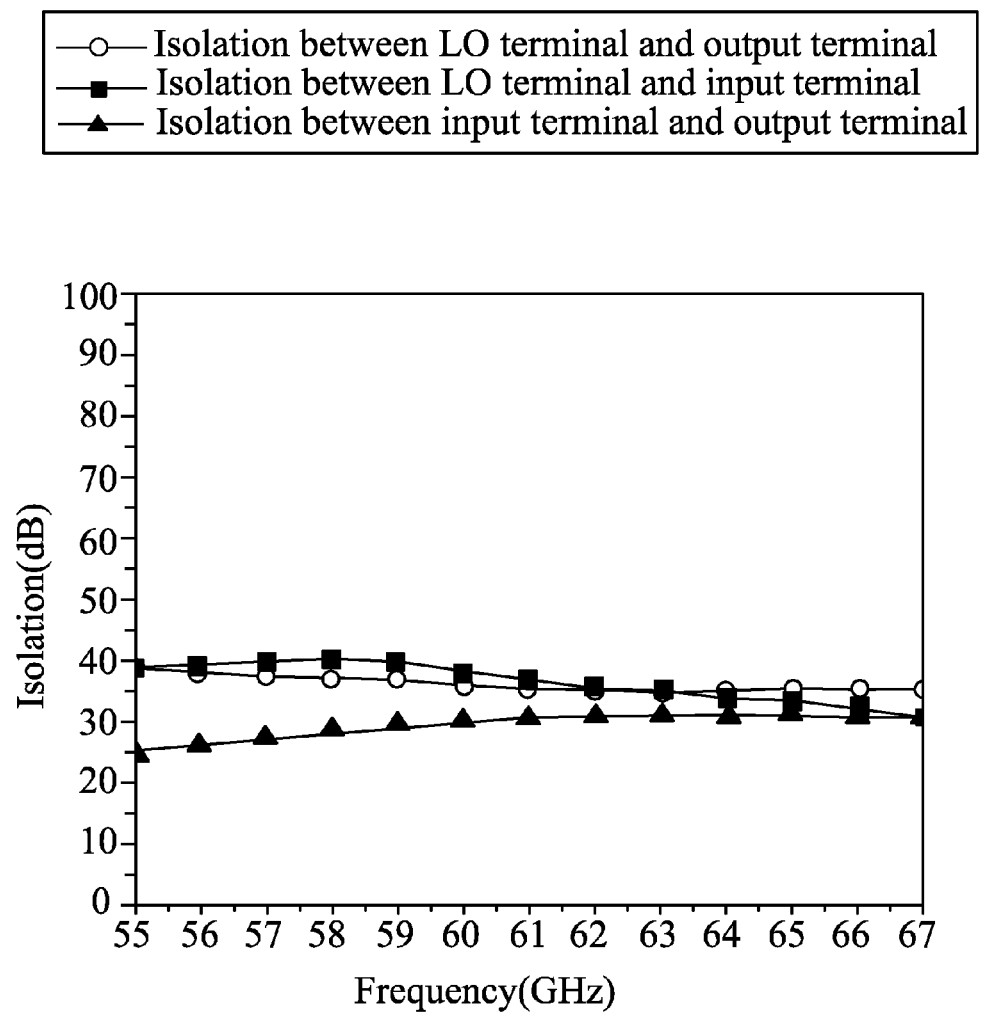
FIG. 2 is a plot showing isolations among an LO terminal, an input terminal, and output terminals of the conventional Gilbert cell mixer circuit.
Figure 3:
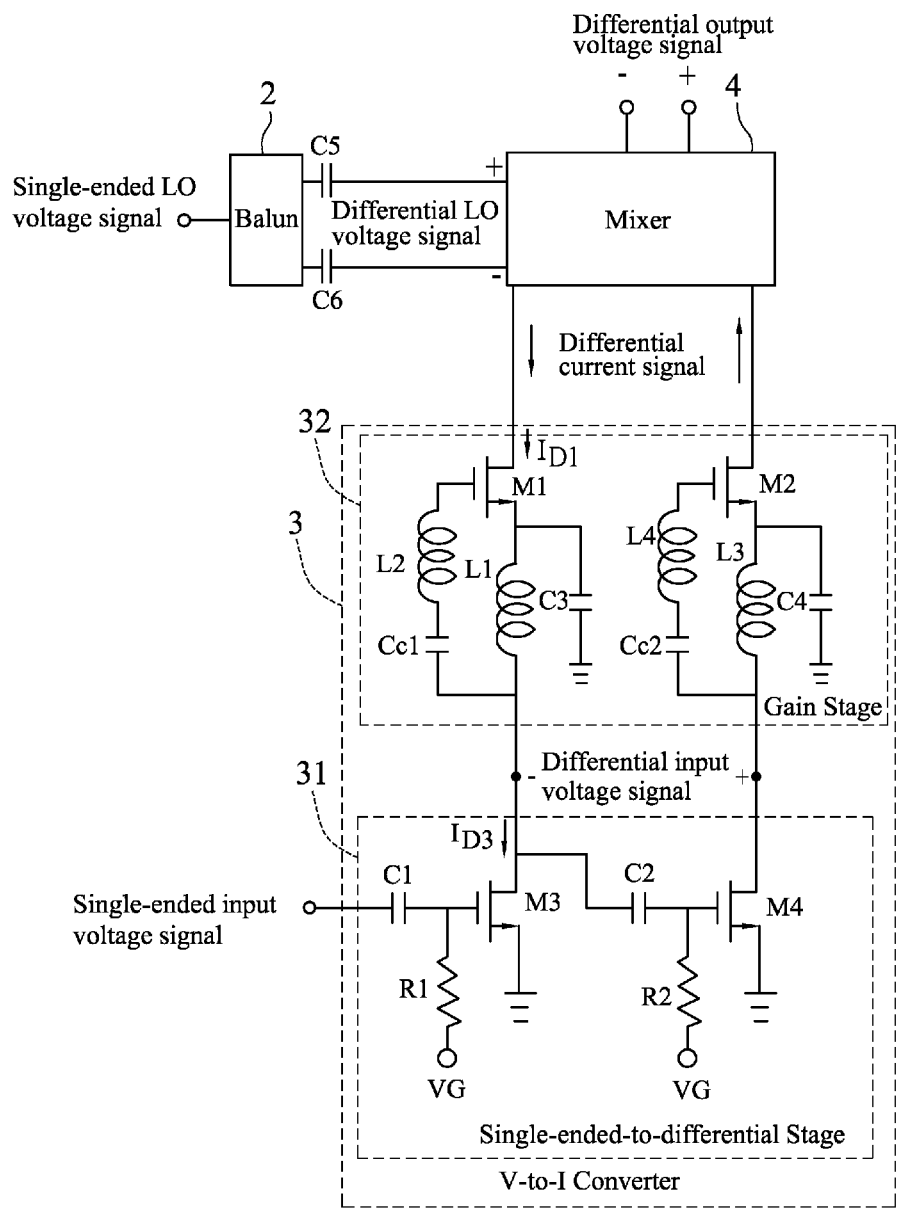
FIG. 3 is a schematic diagram illustrating a preferred embodiment of a frequency mixer circuit according to the present invention.

Referring to FIG. 3, the preferred embodiment of the frequency mixer circuit according to this invention is shown to include a balun 2, a voltage-to-current (V-to-I) converter 3 and a mixer 4.

The balun 2 has a local oscillator (LO) terminal to receive a single-ended LO voltage signal, and converts the single-ended LO voltage signal into a differential LO voltage signal.

The V-to-I converter 3 includes a single-ended-to-differential stage 31 and a gain stage 32.

The single-ended-to-differential stage 31 has an input terminal to receive a single-ended input voltage signal, and converts the single-ended input voltage signal into a differential input voltage signal. Preferably, the single-ended input voltage signal is a radio-frequency signal. In this embodiment, the single-ended-to-differential stage 31 includes two capacitors C1, C2, two transistors M3, M4, and two resistors R1, R2. Each of the transistors M3, M4 has a first terminal, a grounded second terminal and a control terminal.

The capacitor C1 has a first terminal (input terminal) receiving the single-ended input voltage signal, and a second terminal coupled to the control terminal of the transistor M3.

The capacitor C2 is coupled between the first terminal of the transistor M3 and the control terminal of the transistor M4.

The resistor R1 is coupled between the control terminal of the transistor M3 and a bias voltage source VG.

The resistor R2 is coupled between the control terminal of the transistor M4 and the bias voltage source VG.

The gain stage 32 is coupled to the single-ended-to-differential stage 31 for receiving the differential input voltage signal, and performs voltage-to-current conversion to generate a differential current signal with an input frequency. The gain stage 32 includes inductors L1, L2, L3, L4 each having a first terminal and a second terminal, transistors M1, M2 each having a first terminal, a second terminal and a control terminal, coupling capacitors Cc1, Cc2, and capacitors C3, C4.

The second terminals of the inductors L1, L3 are coupled respectively to the first terminals of the transistors M3, M4 of the single-ended-to-differential stage 31 to receive the differential input voltage signal therefrom.

The first terminals of the transistors M1, M2 output the differential current signal with the input frequency. The second terminals of the transistors M1, M2 are coupled respectively to the first terminals of the inductors L1, L3.

The coupling capacitor Cc1 and the inductor L2 are coupled in series to form a first capacitor-inductor pair that is coupled between the control terminal of the transistor M1 and the second terminal of the inductor L1.

The coupling capacitor Cc2 and the inductor L4 are coupled in series to form a second capacitor-inductor pair that is coupled between the control terminal of the second transistor M2 and the second terminal of the inductor L3.

The capacitor C3 is coupled between the first terminal of the inductor L1 and a ground node. The capacitor C4 is coupled between the first terminal of the inductor L3 and the ground node.

The mixer 4 receives a differential LO voltage signal with a LO frequency, is coupled to the first terminals of the transistors M1, M2 of the gain stage 32 for receiving the differential current signal therefrom, and has a pair of output terminals to output a differential output voltage signal having a mixed frequency associated with the input frequency of the differential current signal and the LO frequency of the differential LO voltage signal. For example, when the differential current signal has the input frequency of 60 GHz and the differential LO voltage signal has the LO frequency of 59.9 GHz, the differential output voltage signal has the mixed frequency of 0.1 GHz. A ratio of magnitude of the differential output voltage signal to magnitude of the single-ended input voltage signal is a conversion gain of the frequency mixer circuit.

Figure 4:
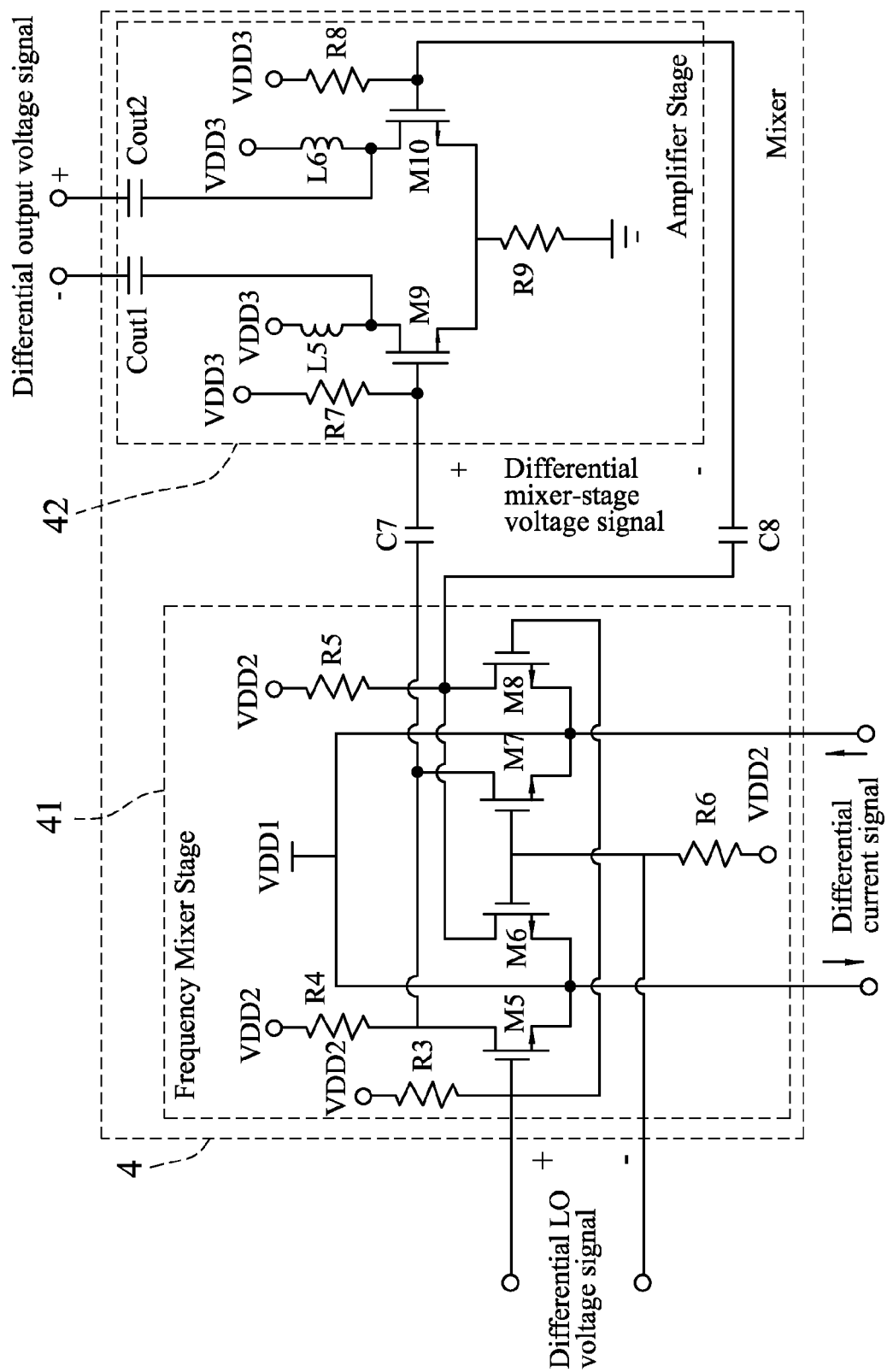
FIG. 4 is a schematic circuit diagram of a mixer of the preferred embodiment.

Referring to FIG. 4, the mixer 4 includes a frequency mixer stage 41 and an amplifier stage 42, and capacitors C7, C8 coupled between the frequency mixer stage 41 and the amplifier stage 42.

The frequency mixer stage 41 is coupled to the first terminals of the transistors M1, M2 of the gain stage 32 for receiving the differential current signal therefrom, receives the differential LO voltage signal from the balun 2 through capacitors C5, C6 (see FIG. 3), and outputs a differential mixer-stage voltage signal with the mixed frequency that is substantially equal to a result of subtracting the LO frequency from the input frequency. In this embodiment, the frequency mixer stage 41 includes transistors M5, M6, M7, M8 and resistors R3, R4, R5, R6.

The transistor M5 has a first terminal, a second terminal coupled to the first terminal of the transistor M1 of the gain stage 32 and a first bias voltage source VDD1, and a control terminal.

The transistor M6 has a first terminal, a second terminal coupled to the second terminal of the transistor M5, and a control terminal cooperating with the control terminal of the transistor M5 to receive the differential LO voltage signal from the gain stage 32.

The transistor M7 has a first terminal coupled to the first terminal of the transistor M5, a second terminal coupled to the first terminal of the transistor M2 of the gain stage 32 and the first bias voltage source VDD1, and a control terminal coupled to the control terminal of the transistor M6.

The transistor M8 has a first terminal coupled to the first terminal of the transistor M6, a second terminal coupled to the second terminal of the transistor M7, and a control terminal coupled to the control terminal of the transistor M5.

The resistor R3 is coupled between the control terminal of the transistor M5 and a second bias voltage source VDD2.

The resistor R4 is coupled between the first terminal of the transistor M5 and the second bias voltage source VDD2.

The resistor R5 is coupled between the first terminal of the transistor M6 and the second bias voltage source VDD2.

The resistor R6 is coupled between the control terminal of the transistor M6 and the second bias voltage source VDD2.

The first terminals of the transistors M5, M7 cooperate with the first terminals of the transistors M6, M8 to output the differential mixer-stage voltage signal.

The capacitor C7 is coupled between the first terminal of the transistor M5 and the amplifier stage 42, and the capacitor C8 is coupled between the first terminal of the transistor M6 and the amplifier stage 42, so as to couple the differential mixer-stage voltage signal to the amplifier stage 42.

The amplifier stage 42 is coupled to the frequency mixer stage 41 through the capacitors C7, C8 for receiving the differential mixer-stage voltage signal, amplifies a magnitude of the differential mixer-stage voltage signal to generate the differential output voltage signal, and has the output terminals to output the differential output voltage signal. In this embodiment, the amplifier stage 42 includes transistors M9, M10 each having a first terminal, a second terminal and a control terminal, resistors R7, R8, R9, inductors L5, L6 and output capacitors Cout1, Cout2.

The second terminal of the transistor M10 is coupled to the second terminal of the transistor M9. The control terminals of the transistors M9, M10 are coupled respectively to the capacitors C7, C8 for receiving the differential mixer-stage voltage signal from the frequency mixer stage 41.

The resistor R7 is coupled between the control terminal of the transistor M9 and a third bias voltage source VDD3.

The resistor R8 is coupled between the control terminal of the transistor M10 and the third bias voltage source VDD3.

The resistor R9 is coupled between the second terminal of the transistor M9 and the ground node.

The inductor L5 is coupled between the first terminal of the transistor M9 and the third bias voltage source VDD3.

The inductor L5 is coupled between the first terminal of the transistor M10 and the third bias voltage source VDD3.

The first output capacitor Cout1 has a first terminal, and a second terminal coupled to the first terminal of the transistor M9.

The second output capacitor Cout2 has a first terminal cooperating with the first terminal of the first output capacitor Cout1 to serve as the output terminals for outputting the differential output voltage signal, and a second terminal coupled to the first terminal of the transistor M10.

In the preferred embodiment, each of the transistors M1 to M10 is an N-type MOSFET having a drain terminal serving as the first terminal thereof, a source terminal serving as the second terminal thereof, and a gate terminal serving as the control terminal thereof.

Through such a circuit design, when the transistors M5 and M8 are turned on by the differential LO voltage signal, the transistors M6 and M7 are turned off, and vice versa.

Figure 5:
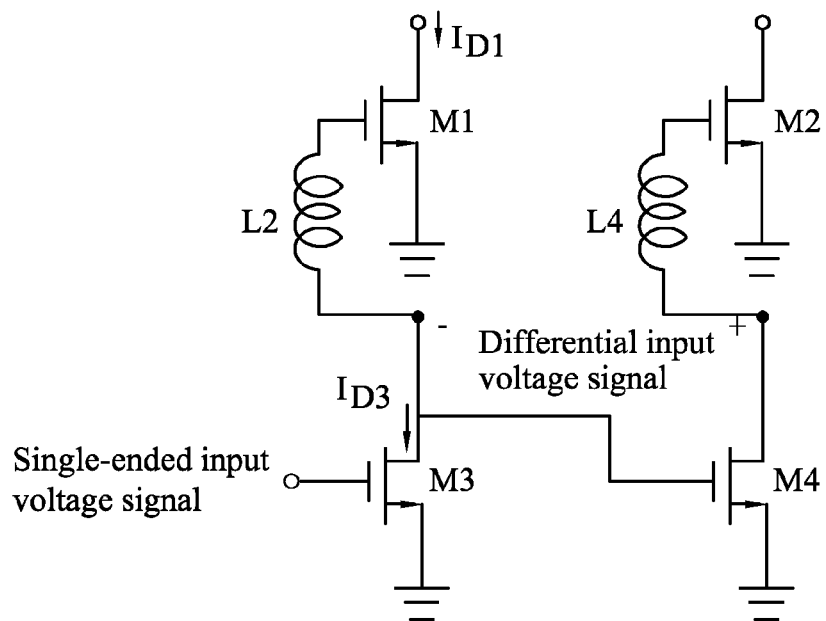
FIG. 5 is an equivalent schematic circuit diagram of a V-to-I converter of the preferred embodiment operating at radio frequency.

Referring to FIG. 5, when the frequency mixer circuit is operated at radio frequency (i.e., both of the single-ended LO voltage signal and the single-ended input voltage signal are radio-frequency signals), the coupling capacitors Cc1, Cc2 and the capacitors C3, C4 are equivalent to short circuits, and the inductors L1, L3 are equivalent to open circuits. The inductors L2, L4 are respectively resonant with parasitic capacitance $C_{gs1}$ (not shown) between the gate terminal and the source terminal of the transistor M1, and parasitic capacitance $C_{gs2}$ (not shown) between the gate terminal and the source terminal of the transistor M2, thereby promoting the conversion gain. A current $I_{D1}$ flowing through the first terminal of the transistor M1 is:

$$I_{D1} = \frac{-g_{m1}}{sC_{gs1}} \times \frac{(sL_1)\|Y_{D3}^{-1}}{[(sL_1)\|Y_{D3}^{-1}] + Z_{in}} \times I_{D3} \quad (1)$$

Figure 6:
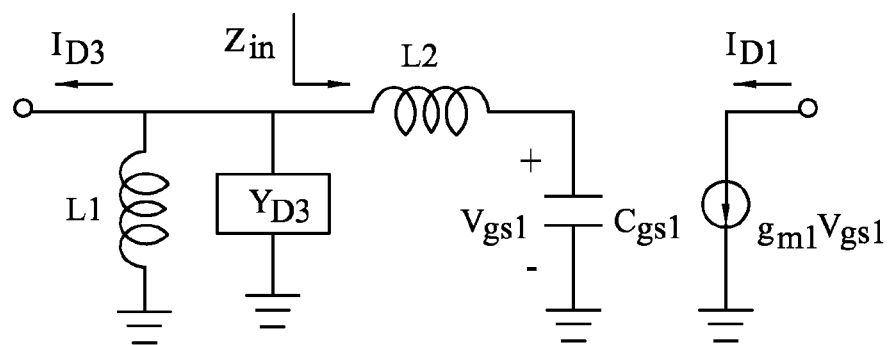
FIG. 6 is a schematic diagram showing a small-signal model of the V-to-I converter of the preferred embodiment.

FIG. 6 is a schematic diagram showing a small-signal model of the V-to-I converter 3 of the preferred embodiment, where $g_{m1}$ represents transconductance of the transistor M1, $C_{gs1}$ represents parasitic capacitance between the gate terminal and the source terminal of the transistor M1, $L_1$ represents inductance of the inductor L1, $Y_{D3}$ represents admittance at the first terminal of the transistor M3, $Z_{in}$ represents input impedance with respect to the gain stage 32, and $I_{D3}$ represents a current flowing through the first terminal of the transistor M3.

When the single-ended input voltage signal has a center frequency of 60 GHz, since $Z_{in} \ll ((sL_1)\|Y_{D3}^{-1})$, so that $$|I_{D1}| \approx \left|\frac{-g_{m1}}{sC_{gs1}}\right| \times |I_{D3}|,$$

where $$w_{T1} = \frac{g_{m1}}{C_{gs1}},$$

and $s=jw_0$, to thereby simplify the equation (1) to be:

$$|I_{D1}| \approx \frac{w_{T1}}{w_0} \times |I_{D3}| > |I_{D3}| \quad (2)$$

where $w_{T1}$ represents a cutoff frequency of the transistor M1 at which a current flowing through the parasitic capacitance $C_{gs1}$ is equal to a current flowing between the drain terminal and the source terminal of the transistor M1 at a state of AC short circuit. Since $w_{T1}$ is proportional to $g_{m1}$, and $g_{m1}$ is proportional to a W/L ratio of the transistor M1, the $w_{T1}$ may be arranged to be $w_{T1}=5.61\times10^{11}$ rad/sec by design of the W/L ratio of the transistor M1, to thereby make the $w_{T1}/w_0$ be approximate to 1.49, resulting in $I_{D1}>I_{D3}$, which is different from $I_{D1}\approx I_{D3}$ obtained using the aforementioned conventional Gilbert cell mixer circuit.

The frequency mixer circuit of the preferred embodiment has the conversion gain (CG) as given in the following equation:

$$CG = \frac{VDIF}{VRF} = \frac{I_{D1}}{I_{D3}} \times g_{m3} \times R \times A \quad (3)$$

where VDIF represents the differential output voltage signal, VRF represents the single-ended input voltage signal, $g_{m3}$ represent transconductance of the transistor M3, R represents an equivalent output impedance with respect to the first terminal of the transistor M1, and A represents a conversion gain of the mixer 4.

As mentioned hereinbefore, according to this invention, since W/L ratio of the transistor M1 may be designed to result in $I_{D1}>I_{D3}$, and the output impedance R of this invention is greater than that of the output impedance of the conventional Gilbert cell mixer circuit, the conversion gain of the present invention may be greater than that of the conventional Gilbert cell mixer circuit.

Figure 7:
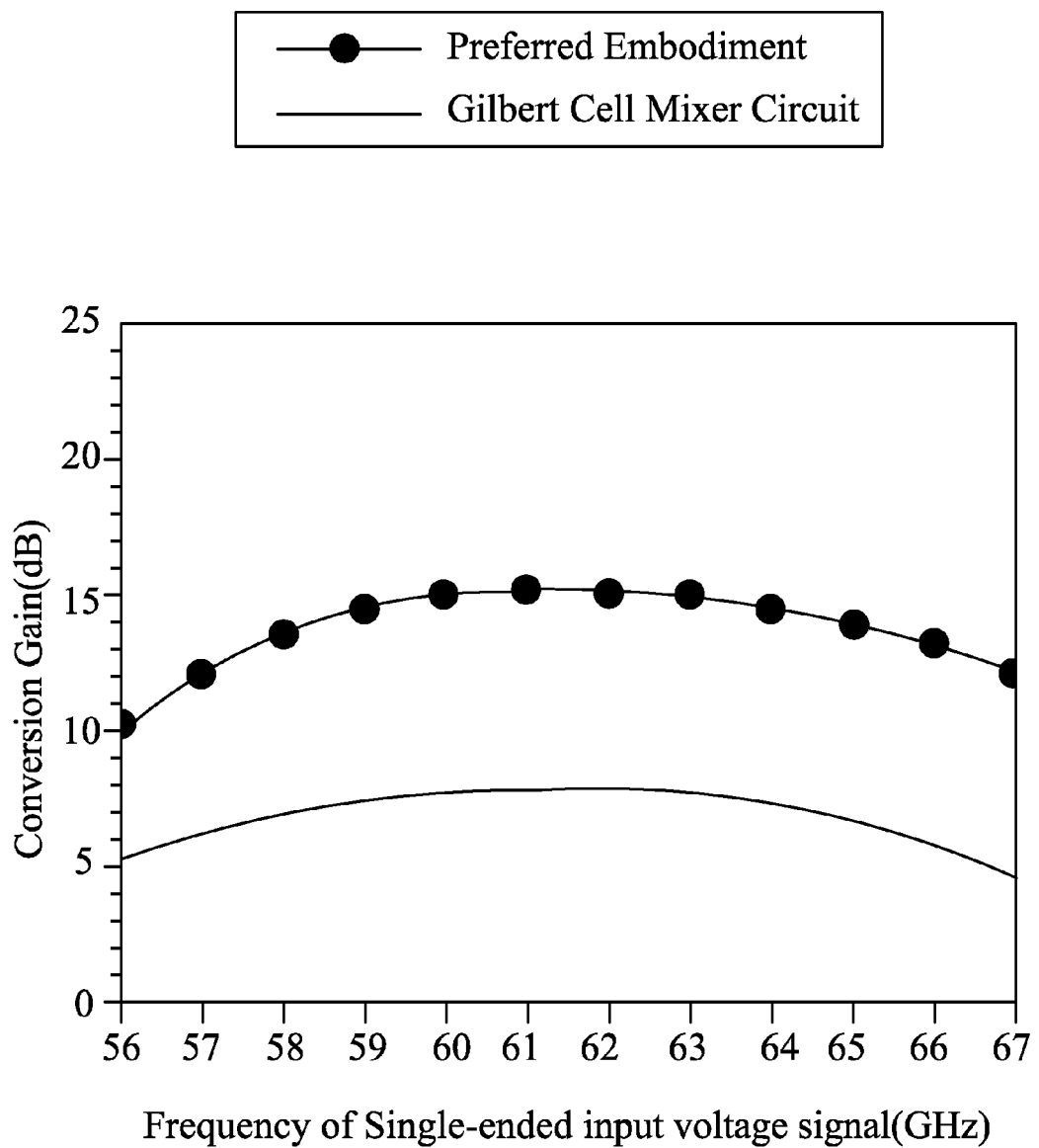
FIG. 7 is a plot showing relationship between conversion gain and frequency of a single-ended input voltage signal received by the preferred embodiment.

FIG. 7 illustrates that the conversion gain of the preferred embodiment is apparently greater than that of the conventional Gilbert cell mixer circuit.

Figure 8:
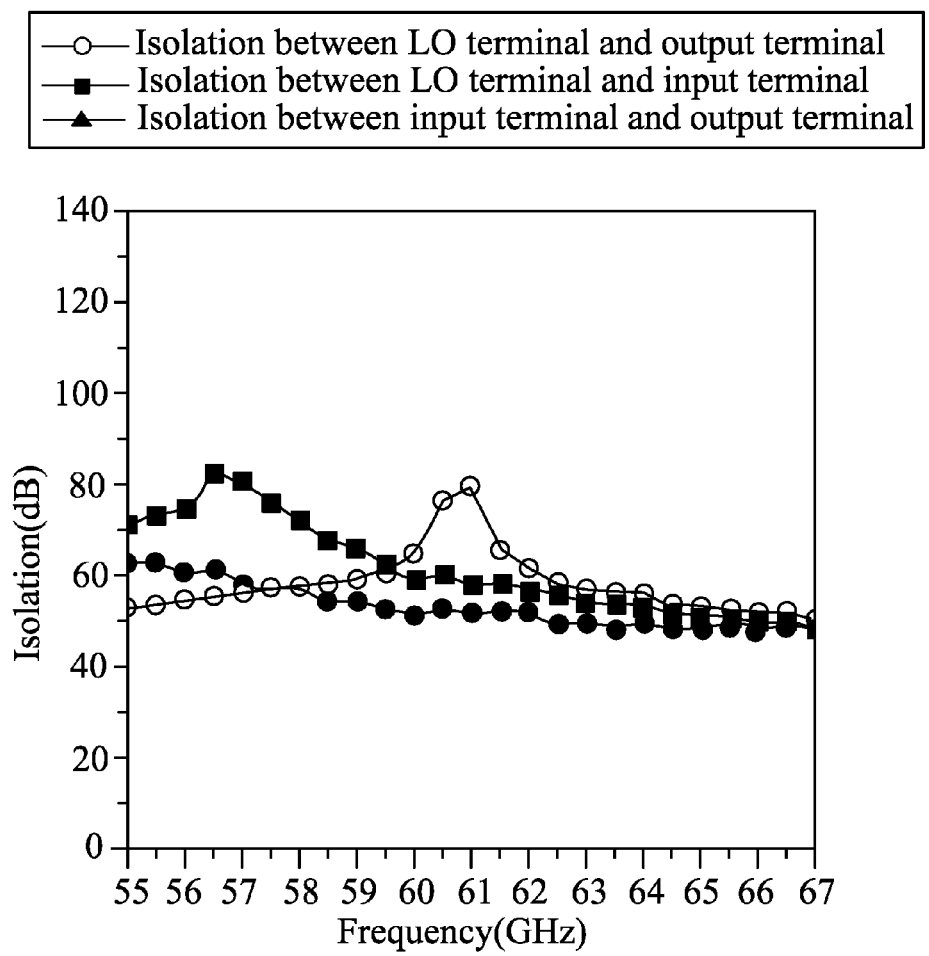
FIG. 8 is a plot showing isolations among an LO terminal, an input terminal, and output terminals of the preferred embodiment.

FIG. 8 illustrates that, when the single-ended input voltage signal has a frequency of 60 GHz, and the single-ended LO voltage signal has a frequency of 59.9 GHz, in terms of isolation between the LO terminal and the output terminals, isolation between the LO terminal and the input terminal, and isolation between the input terminal and the output terminals, the preferred embodiment is better than the conventional Gilbert cell mixer circuit.

The following Table 1 lists some parameters and measurement results using the preferred embodiment.

TABLE 1

| | |
|---|---|
| Input frequency (GHz) | 58.7~64.1 |
| Output frequency (GHz) | 0.1 |
| Conversion gain (dB) | 15.46 |
| Isolation between LO terminal and input terminal (dB) | 64.7 |
| Isolation between LO terminal and output terminal (dB) | 51.5 |
| Isolation between input terminal and output terminal (dB) | 59.5 |
| Power consumption (mW) | 17 |
| CMOS process (nm) | 90 |

Table 1 shows that the preferred embodiment has relatively high conversion gain, low power consumption, and good isolation.

To sum up, the preferred embodiment according to the present invention has the following advantages:

1. Higher conversion gain: Since the inductors L2, L4 are respectively resonant with the parasitic capacitance $C_{gs1}$ between the gate terminal and the source terminal of the transistor M1, and the parasitic capacitance $C_{gs2}$ between the gate terminal and the source terminal of the transistor M2, the current $I_{D1}$ is greater than the current $I_{D3}$, and the equivalent output impedance of the preferred embodiment is greater than that of the prior art, resulting in a relatively high conversion gain.

2. Better isolation: Since the preferred embodiment has two transistor stages (the transistors M1, M2 are cascoded respectively with the transistors M3, and M4), and the inductors L2, L4 are respectively resonant with parasitic capacitance $C_{gd1}$ between the gate terminal and the drain terminal of the transistor M1, and parasitic capacitance $C_{gd2}$ between the gate terminal and the drain terminal of the transistor M2 to form equivalent open circuits when the preferred embodiment operates at radio frequency, effects of the parasitic capacitances $C_{gd1}$, $C_{gd2}$ on isolations may be reduced, resulting in better isolations among the LO terminal, the input terminal and the output terminal.

3. Low power consumption and good linearity: In DC analysis, the inductors L1, L3 are equivalent to short circuits, and the capacitors Cc1, Cc2, C3, C4 are equivalent to open circuits, so that the transistors M1, M3 share the same current and the transistors M2, M4 share the same current, resulting in low power consumption and good linearity.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A frequency mixer circuit comprising:
  a gain stage including:
    first and second inductors each having a first terminal and a second terminal, said second terminals of said first and second inductors being disposed to receive a differential input voltage signal;
    first and second transistors each having a first terminal, a second terminal and a control terminal, said first terminals of said first and second transistors outputting a differential current signal with an input frequency, said second terminals of said first and second transistors being coupled respectively to said first terminals of said first and second inductors;
    a first capacitor-inductor pair that includes a capacitor and an inductor coupled in series and that is coupled between said control terminal of said first transistor and said second terminal of said first inductor; and
    a second capacitor-inductor pair that includes a capacitor and an inductor coupled in series and that is coupled between said control terminal of said second transistor and said second terminal of said second inductor; and
  a mixer disposed to receive a differential local oscillator (LO) voltage signal with a LO frequency, coupled to said first terminals of said first and second transistors of said gain stage for receiving the differential current signal therefrom, and configured to output a differential output voltage signal having a mixed frequency associated with the input frequency and the LO frequency.

2. The frequency mixer circuit as claimed in claim 1, wherein said gain stage further includes a first capacitor disposed to couple said first terminal of said first inductor to a ground node, and a second capacitor disposed to couple said first terminal of said second inductor to the ground node.

3. The frequency mixer circuit as claimed in claim 1, further comprising a single-ended-to-differential stage disposed to receive a single-ended input voltage signal, configured to convert the single-ended input voltage signal into the differential input voltage signal, and coupled to said second terminals of said first and second inductors of said gain stage for providing the differential input voltage signal thereto; wherein a ratio of magnitude of the differential output voltage signal to magnitude of the single-ended input voltage signal is defined as a conversion gain.

4. The frequency mixer circuit as claimed in claim 3, wherein said single-ended-to-differential stage includes:
  third and fourth transistors each having a first terminal, a grounded second terminal and a control terminal, said first terminals of said third and fourth transistors being coupled to said second terminals of said first and second inductors of said gain stage and outputting the differential input voltage signal thereto;
  a first capacitor having a first terminal disposed to receive the single-ended input voltage signal, and a second terminal coupled to said control terminal of said third transistor;
  a second capacitor coupled between said first terminal of said third transistor and said control terminal of said fourth transistor;
  a first resistor disposed to couple said control terminal of said third transistor to a bias voltage source; and
  a second resistor disposed to couple said control terminal of said fourth transistor to the bias voltage source.

5. The frequency mixer circuit as claimed in claim 4, wherein each of said first, second, third and fourth transistors is an N-type MOSFET having a drain terminal serving as said first terminal thereof, a source terminal serving as said second terminal thereof, and a gate terminal serving as said control terminal thereof.

6. The frequency mixer circuit as claimed in claim 4, wherein said mixer includes:
  a frequency mixer stage coupled to said first terminals of said first and second transistors of said gain stage for receiving the differential current signal therefrom, disposed to receive the differential LO voltage signal, and configured to output a differential mixer-stage voltage signal with the mixed frequency that is substantially equal to a result of subtracting the LO frequency from the input frequency; and an amplifier stage coupled to said frequency mixer stage for receiving the differential mixer-stage voltage signal, and configured to amplify a magnitude of the differential mixer-stage voltage signal, so as to output the differential output voltage signal.

7. The frequency mixer circuit as claimed in claim 6, wherein said frequency mixer stage includes:
   a fifth transistor having a first terminal, a second terminal coupled to said first terminal of said first transistor of said gain stage and to be coupled to a first bias voltage source, and a control terminal;
   a sixth transistor having a first terminal, a second terminal coupled to said second terminal of said fifth transistor, and a control terminal cooperating with said control terminal of said fifth transistor to receive the differential LO voltage signal;
   a seventh transistor having a first terminal coupled to said first terminal of said fifth transistor, a second terminal coupled to said first terminal of said second transistor of said gain stage and to be coupled to the first bias voltage source, and a control terminal coupled to said control terminal of said sixth transistor;
   an eighth transistor having a first terminal coupled to said first terminal of said sixth transistor, a second terminal coupled to said second terminal of said seventh transistor, and a control terminal coupled to said control terminal of said fifth transistor;
   a third resistor disposed to couple said control terminal of said fifth transistor to a second bias voltage source;
   a fourth resistor disposed to couple said first terminal of said fifth transistor to the second bias voltage source;
   a fifth resistor disposed to couple said first terminal of said sixth transistor to the second bias voltage source; and
   a sixth resistor disposed to couple said control terminal of said sixth transistor to the second bias voltage source;
   wherein said first terminals of said fifth and seventh transistors cooperate with said first terminals of said sixth and eighth transistors to output the differential mixer-stage voltage signal.

8. The frequency mixer circuit as claimed in claim 7, wherein said mixer further includes a third capacitor coupled between said first terminal of said fifth transistor of said frequency mixer stage and said amplifier stage, and a fourth capacitor coupled between said first terminal of said sixth transistor of said frequency mixer stage and said amplifier stage.

9. The frequency mixer circuit as claimed in claim 7, wherein said amplifier stage includes:
   a ninth transistor having a first terminal, a second terminal and a control terminal;
   a tenth transistor having a first terminal, a second terminal coupled to said second terminal of said ninth transistor, and a control terminal cooperating with said control terminal of said ninth transistor to receive the differential mixer-stage voltage signal;
   a seventh resistor disposed to couple said control terminal of said ninth transistor to a third bias voltage source;
   an eighth resistor disposed to couple said control terminal of said tenth transistor to the third bias voltage source;
   a ninth resistor disposed to couple said second terminal of said ninth transistor to a ground node;
   a first output capacitor having a first terminal, and a second terminal coupled to said first terminal of said ninth transistor; and
   a second output capacitor having a first terminal cooperating with said first terminal of said first output capacitor to output the differential output voltage signal, and a second terminal coupled to said first terminal of said tenth transistor.

10. The frequency mixer circuit as claimed in claim 9, wherein said amplifier stage further includes a third inductor disposed to couple said first terminal of said ninth transistor to the third bias voltage source, and a fourth inductor disposed to couple said first terminal of said tenth transistor to the third bias voltage source.

11. The frequency mixer circuit as claimed in claim 9, wherein each of said fifth, sixth, seventh, eighth, ninth and tenth transistors is an N-type MOSFET having a drain terminal serving as said first terminal thereof, a source terminal serving as said second terminal thereof, and a gate terminal serving as said control terminal thereof.

12. The frequency mixer circuit as claimed in claim 1, wherein said mixer includes:
   a frequency mixer stage coupled to said first terminals of said first and second transistors of said gain stage for receiving the differential current signal therefrom, disposed to receive the differential LO voltage signal, and configured to output a differential mixer-stage voltage signal with the mixed frequency that is substantially equal to a result of subtracting the LO frequency from the input frequency; and
   an amplifier stage coupled to said frequency mixer stage for receiving the differential mixer-stage voltage signal, and configured to amplify a magnitude of the differential mixer-stage voltage signal, so as to output the differential output voltage signal.

13. The frequency mixer circuit as claimed in claim 12, wherein said frequency mixer stage includes:
   a third transistor having a first terminal, a second terminal coupled to said first terminal of said first transistor of said gain stage and to be coupled to a first bias voltage source, and a control terminal;
   a fourth transistor having a first terminal, a second terminal coupled to said second terminal of said third transistor, and a control terminal cooperating with said control terminal of said third transistor to receive the differential LO voltage signal;
   a fifth transistor having a first terminal coupled to said first terminal of said third transistor, a second terminal coupled to said first terminal of said second transistor of said gain stage and to be coupled to the first bias voltage source, and a control terminal coupled to said control terminal of said fourth transistor;
   a sixth transistor having a first terminal coupled to said first terminal of said fourth transistor, a second terminal coupled to said second terminal of said fifth transistor, and a control terminal coupled to said control terminal of said third transistor;
   a first resistor disposed to couple said control terminal of said third transistor to a second bias voltage source;
   a second resistor disposed to couple said first terminal of said third transistor to the second bias voltage source;
   a third resistor disposed to couple said first terminal of said fourth transistor to the second bias voltage source; and
   a fourth resistor disposed to couple said control terminal of said fourth transistor to the second bias voltage source;
   wherein said first terminals of said third and fifth transistors cooperate with said first terminals of said fourth and sixth transistors to output the differential mixer-stage voltage signal.

14. The frequency mixer circuit as claimed in claim 13, wherein each of said third, fourth, fifth and sixth transistors is an N-type MOSFET having a drain terminal serving as said first terminal thereof, a source terminal serving as said second terminal thereof, and a gate terminal serving as said control terminal thereof.

15. The frequency mixer circuit as claimed in claim 12, wherein said amplifier stage includes:
    a third transistor having a first terminal, a second terminal and a control terminal;
    a fourth transistor having a first terminal, a second terminal coupled to said second terminal of said third transistor, and a control terminal cooperating with said control terminal of said third transistor to receive the differential mixer-stage voltage signal;
    a first resistor disposed to couple said control terminal of said third transistor to a bias voltage source;
    a second resistor disposed to couple said control terminal of said fourth transistor to the bias voltage source;
    a third resistor disposed to couple said second terminal of said third transistor to a ground node;
    a first output capacitor having a first terminal, and a second terminal coupled to said first terminal of said third transistor; and
    a second output capacitor having a first terminal cooperating with said first terminal of said first output capacitor to output the differential output voltage signal, and a second terminal coupled to said first terminal of said fourth transistor.

16. The frequency mixer circuit as claimed in claim 15, wherein said amplifier stage further includes a third inductor disposed to couple said first terminal of said third transistor to the bias voltage source, and a fourth inductor disposed to couple said first terminal of said fourth transistor to the bias voltage source.

17. The frequency mixer circuit as claimed in claim 15, wherein each of said third and fourth transistors is an N-type MOSFET having a drain terminal serving as said first terminal thereof, a source terminal serving as said second terminal thereof, and a gate terminal serving as said control terminal thereof.

18. The frequency mixer circuit as claimed in claim 1, further comprising a balun disposed to receive a single-ended LO voltage signal, configured to convert the single-ended LO voltage signal into the differential LO voltage signal, and coupled to said mixer for providing the differential LO voltage signal thereto.

* * * * *